(12) United States Patent
Liu

(10) Patent No.: US 6,969,974 B1
(45) Date of Patent: Nov. 29, 2005

(54) BATTERY FUEL GAUGE USING SAFETY CIRCUIT

(75) Inventor: Yong Liu, Shanghai (CN)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/980,553

(22) Filed: Nov. 3, 2004

(51) Int. Cl.$^7$ ............................. H02J 7/00; G08B 21/00
(52) U.S. Cl. ............................. 320/132; 320/DIG. 21; 340/636.12
(58) Field of Search .................. 320/DIG. 21, 132, 320/134, 101; 340/636.12

(56) References Cited

U.S. PATENT DOCUMENTS

| | | | | |
|---|---|---|---|---|
| 5,767,657 | A | * | 6/1998 | Oglesbee ................ 320/101 |
| 6,304,063 | B2 | * | 10/2001 | Maloizel et al. .......... 320/134 |
| 6,879,133 | B1 | * | 4/2005 | Geren ..................... 320/134 |
| 2004/0036620 | A1 | * | 2/2004 | Herrmann et al. ..... 340/636.12 |

* cited by examiner

Primary Examiner—Pia Tibbits
(74) Attorney, Agent, or Firm—Philip H. Burrus, IV

(57) ABSTRACT

A safety circuit for a rechargeable cell is employed as a simple, low cost, fuel gauging circuit. The safety circuit includes an undervoltage circuit having a reference voltage. The input of the safety circuit is selectively coupled between the voltage of a rechargeable cell and a scaled down voltage of the rechargeable cell. The scaled down voltage corresponds to a predetermined capacity threshold. A user or electronic device actuates a switch that couples the scaled down voltage to the safety circuit. The safety circuit compares this scaled down voltage to the reference voltage of it's under voltage circuit. If the scaled down voltage is above the reference voltage, the safety circuit causes a transistor coupled serially with the cell to be on, or in a conductive state, so as to allow current to flow through a capacity indicator like a LED. If the scaled down voltage is below the reference voltage the safety circuit causes the transistor to enter a high impedance state, thereby turning the indicator off. The state of the indicator provides the user with an approximation of the cell's remaining capacity. In a battery pack, two or more safety circuits with different reference voltages may be employed for increased resolution.

20 Claims, 3 Drawing Sheets

BATTERY FUEL GAUGE USING SAFETY CIRCUIT

BACKGROUND

1. Technical Field

This invention relates generally rechargeable batteries, and more specifically to a fuel gauging circuit that employs a safety circuit to determine the remaining capacity of a rechargeable cell.

2. Background Art

Portable electronic devices, like cellular telephones, pagers and two-way radios for example, derive their portability from rechargeable batteries. Such batteries provide users freedom in that they no longer need to have a cord tethered to a wall outlet to use these devices.

While many people may think that a rechargeable battery is simply a cell and a plastic housing, nothing could be further from the truth. Rechargeable battery packs often include circuit boards, electronic circuitry, mechanical assemblies and electromechanical protection components. The circuits employed in rechargeable battery packs include charging circuits that start, ramp, taper and stop current, and measure temperature, just to name a few of the functions. Simply put, a battery pack is a complex system of components working in harmony to safely deliver power to a portable electronic device.

One of the most common consumer issues with rechargeable battery packs is determining how much "charge" is left in the battery. Many a foul word has been uttered by a person who grabs a battery, attaches it to a portable device, and walks out of the house, only to find that the battery is dead. Some people use multiple batteries with a particular electronic device, and switch back and forth between the batteries during the day. Nothing is more frustrating that not knowing which one is the "charged" battery and which one is "dead".

One prior art solution to this problem is a Coulomb-counting fuel gauge circuit. These fuel gauging circuits typically employ a current sensing resistor to measure the current flowing in and out of a rechargeable cell in a battery pack. As such, they "count" the Coulombs of current flowing in or out of the cell, and add or subtract this count from a total capacity stored in memory.

The problem with these fuel gauging circuits is two fold: First, unless they are perfectly accurate, they accumulate error. For example, if instead of measuring 1 Coulomb of current flowing out of the cell, the fuel gauging circuit measures 0.99 Coulombs, the capacity will be off by 1%. When the same Coulomb flows back into the cell, it will also be measured with the same 1% error, which is now compounded. Hence, the capacity will now be 2% off. As this process continues, the capacity gets less and less accurate.

The second problem is the cost. Coulomb-counting fuel gauge circuits are quite expensive when compared to the overall cost of a rechargeable battery pack. For this reason, manufacturers are often reluctant to include the fuel gauging circuitry in many battery packs.

There is thus a need for a simple, inexpensive fuel gauging circuit that allows a user to determine the approximate remaining capacity of a battery pack.

DETAILED DESCRIPTION OF THE INVENTION

Figure 1:
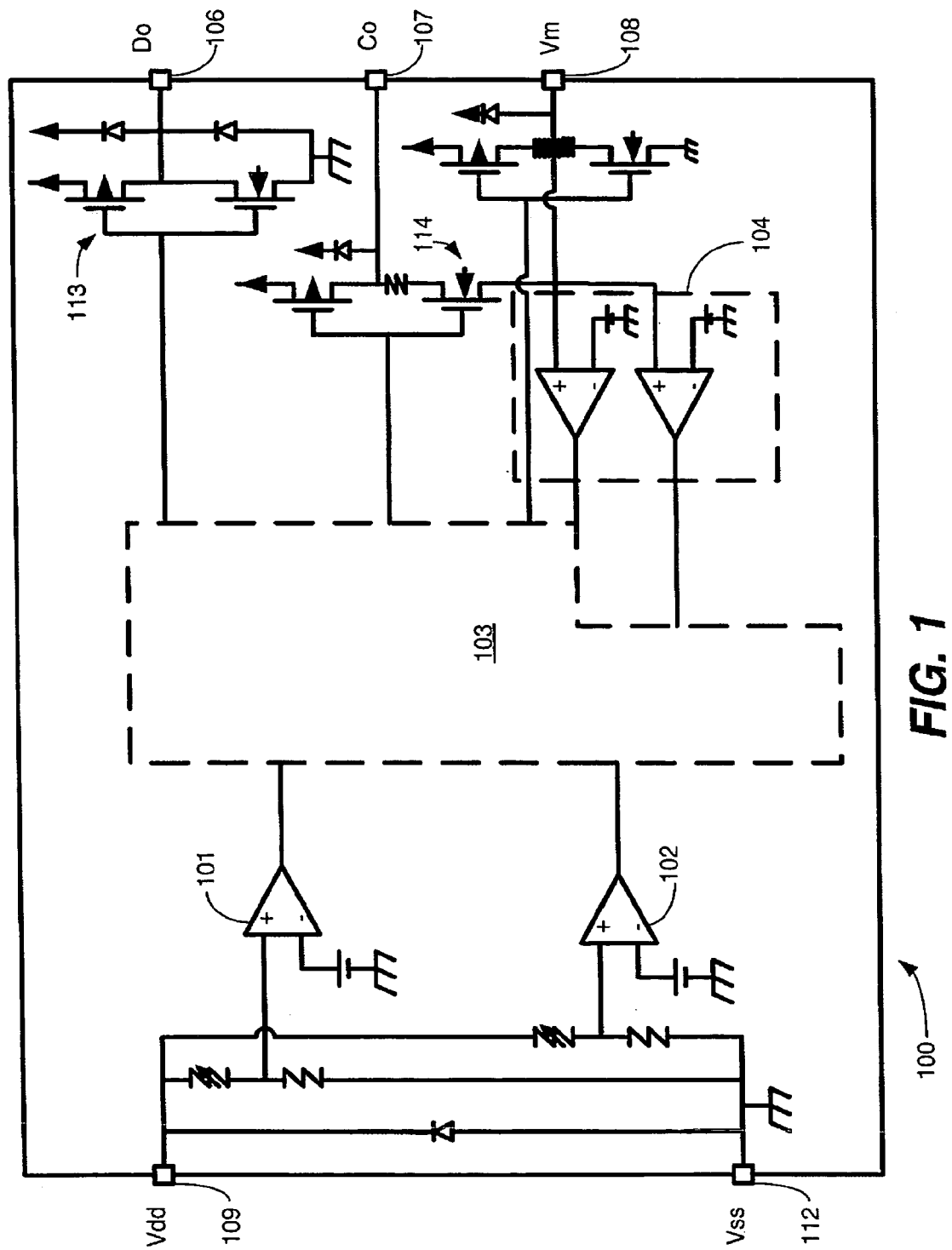
FIG. 1 illustrates a prior art safety circuit for rechargeable cells.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

This invention is a simple, inexpensive fuel gauge circuit that gives a user an approximation of the amount of energy stored in a rechargeable cell. The fuel gauge circuit employs a battery protection circuit and takes advantage of the safety circuit's internal undervoltage detector circuit to determine the cell capacity. By coupling a scaled cell voltage to the undervoltage detector of the safety circuit, the invention can determine whether the cell voltage—which is proportional to energy capacity—is above or below a predetermined threshold.

For example, if the threshold is proportional to 50% capacity, a capacity indicator, like a light emitting diode for example, may illuminate when the capacity is greater than 50%, thereby letting the user know that the cell has more than half of its capacity remaining. In an alternate embodiment, two safety circuits are used to tell the user if the battery is above, for example 60% capacity, between 5% and 60%, or below 5% capacity.

Prior to understanding the invention, a brief overview of battery safety circuits is warranted. As used herein, a "safety circuit" is any circuit capable of monitoring the voltage across at least one rechargeable cell. One example of such a circuit is the S8241 series of safety circuits manufactured by Seiko Instruments, Inc. For discussion and exemplary purposes in understanding the invention, such a safety circuit will be discussed herein. It will be clear to those of ordinary skill in the art who have the benefit of this disclosure, however, that the invention is not so limited. Discrete circuits, application specific circuits and safety circuits manufactured by other companies, including Ricoh and Mitsumi for example, may be equally substituted for the Seiko circuit.

By way of background, referring now to FIG. 1, illustrated therein is a block diagram of an S-8241 safety circuit 100. The S-8241 safety circuit is designed to be used with a single, lithium-based cell. Again, it will be clear to those of ordinary skill in the art with the benefit of this disclosure that the invention is not so limited. The fuel gauge circuit discussed herein may be equally applied to any combination of serial or parallel cells of any chemistry.

The safety circuit 100 may be a single integrated circuit (IC) that provides a means for monitoring of cell voltage or voltage and current, and thereby controlling the charging and discharging of the cells within a battery pack. Discrete equivalents of the IC may also be substituted.

The safety circuit 100 includes an overcharge detector 101 that monitors the voltage across the cell. The overcharge detector 101 compares this voltage to a predetermined maximum cell voltage. When the cell voltage exceeds this threshold, the overcharge detector 101, via some internal logic circuitry 103, causes a push-pull output stage 114 to actuate the charge pin 107. When the charge pin 107 is coupled to a disconnect means, like a transistor, the transistor opens so as to prevent any further charging of the cell.

Similarly, the safety circuit includes an overdischarge detector 102 that ensures that the voltage across the cell does not fall below a predetermined threshold. If it does, the overdischarge detector 102 causes an output stage 113 to actuate the discharge pin 106. When the discharge pin 106 is coupled to a disconnect means, like a serial transistor, actuation of the discharge pin 106 prevents any further discharge.

Cell current is monitored by way of an overcurrent detection pin 108 coupled to an overcurrent detection circuit 104. The overcurrent detection pin 108 senses the voltage between the Vss pin 112 and the overcurrent detection pin 108. When this voltage exceeds a predetermined threshold, the overcurrent circuit 104 causes the discharging pin 106 to actuate, thereby stopping the flow of current in the discharge direction. Other components of the safety circuit 100 include a Vdd pin 109 and a Vss pin 112, that monitor the voltage at the cathode and at the anode of serial cells, respectively.

Figure 2:
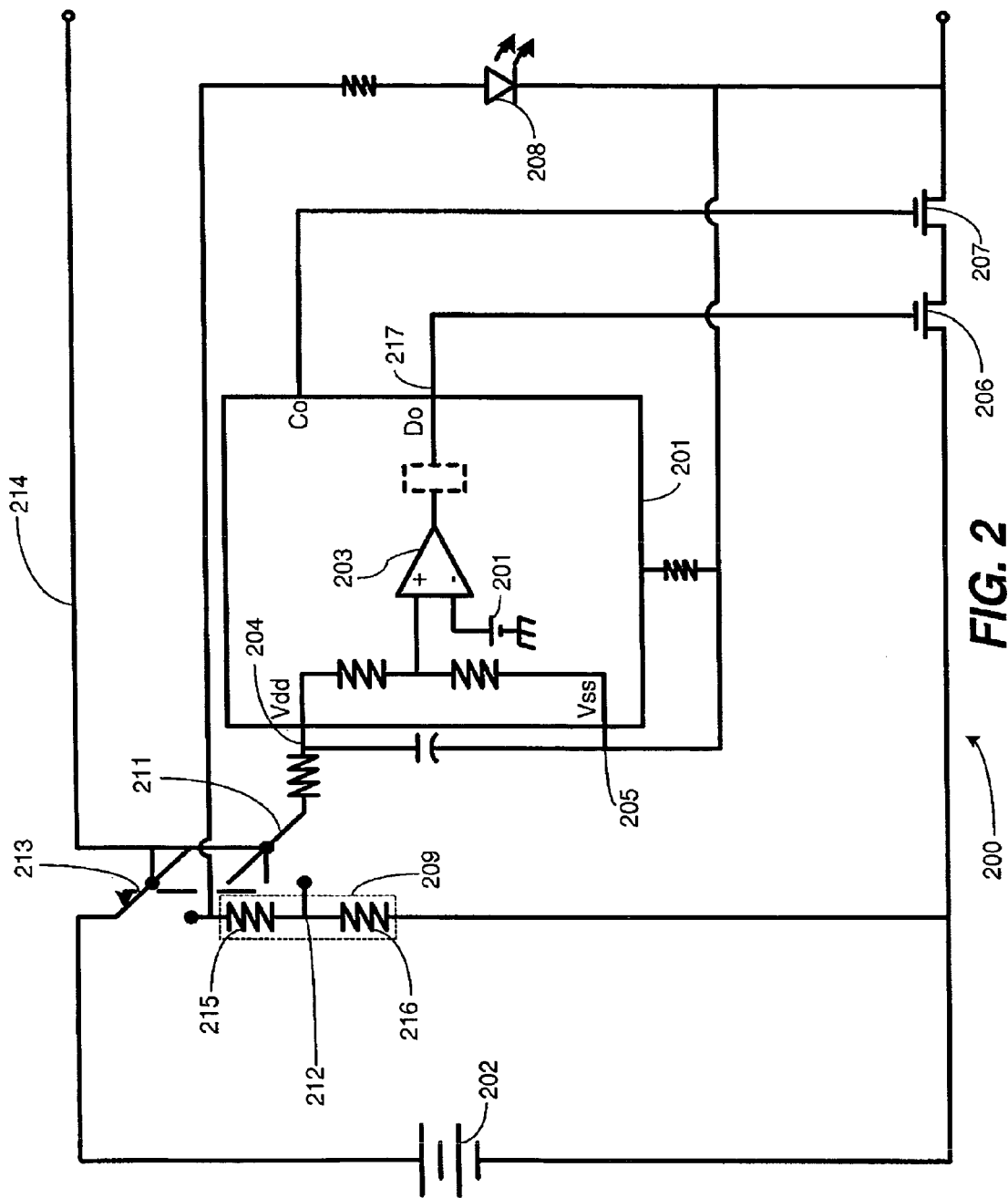
FIG. 2 illustrates a fuel gauging circuit in accordance with the invention employing a single safety circuit.

Turning now to FIG. 2, illustrated therein is one preferred embodiment of a fuel gauge circuit 200 in accordance with the invention. This circuit 200 employs a single safety circuit 201, and thus provides a binary capacity indication. The indication is binary in that it alerts the user as to whether the capacity is above or below a particular threshold. For example, if the threshold is 50%, the binary capacity indication will tell the user if the battery is more or less than half charged.

The circuit 200 includes at least one rechargeable cell 202 electrically coupled to the safety circuit 201. The safety circuit 201 includes an undervoltage detection circuit 203, which will be employed as a capacity detector in accordance with this invention. As note above, the undervoltage detection circuit 203 is a circuit for monitoring the voltage across the cell 202 by way of the Vdd pin 204 and the Vss pin 205.

There is at least one current interrupt device, e.g. 206 or 207, coupled serially with the cell 202. In this particular embodiment, the current interrupt device 206,207 is a MOSFET transistor. Here, transistor 206 is known as the "discharge FET", and transistor 207 is known as the "charge FET". Other interrupt devices, like bipolar transistors, switches, relays, and similar devices could be used as well. Additionally, this particular embodiment employs the discharge FET 206 for fuel gauging. It will be clear to those of ordinary skill in the art having the benefit of this disclosure that the charge FET 207 or other, additional interrupt devices may also be used.

A capacity indicator 208 provides the capacity indication to the user. In this particular embodiment, the capacity indicator 208 is a light emitting diode (LED). It will be clear to those of ordinary skill in the art having the benefit of this disclosure that other indicators, including audible devices, display screens and other visual devices may also be employed. In this embodiment, the capacity indicator 208 is coupled to the current interrupt device, i.e. the discharge FET 206, so that the capacity indicator 208 will be active when the discharge FET 206 is closed (thereby allowing current to flow through the capacity indicator 208).

A voltage divider 209 is coupled across the cell 202. The voltage divider 209, which may be as simple as a resistor divider, steps down the voltage of the cell 202. This "stepped down" voltage is then fed into the undervoltage circuit 203 and is compared to a reference voltage 210. If the stepped down cell voltage is proportional to a voltage associated with a predetermined capacity threshold, the undervoltage circuit 203 may be used to determine whether the actual cell capacity is above or below that particular threshold. This will be explained in more detail below.

A switch 211 is coupled between the midpoint 212 of the voltage divider 209 and the Vdd pin 204 of the safety circuit 201. Note that multiple switch arrangements may be used to selectively couple the voltage divider 209 and capacity indicators into the circuit 200. In the embodiment of FIG. 2 a first switch 211 and corresponding switch 213 may be used in conjunction to selectively couple the voltage divider 209 and capacity indicators 208,308 to the circuit 300. As will be seen in FIG. 3, a single, dual-pole, dual throw switch may be substituted for switches 211 and 213.

The operation of the circuit 200 will now be explained in detail. Exemplary voltage numbers will be used for illustrative purposes. It will be clear to those of ordinary skill in the art having the benefit of this disclosure that any number of voltages for the references, stepped down voltages and predetermined capacity threshold voltages may be equally substituted.

Under normal operation, switch 211 is not actuated, causing node 214, i.e. the cell voltage, to be coupled to the Vdd pin 204 of the safety circuit 201. In so doing, the undervoltage circuit 203 monitors the voltage of the cell 202 so as to ensure that the cell voltage does not fall below a predetermined undervoltage threshold limit. In the Seiko S-8241, for example, this voltage can be anywhere between 2.0 and 3.0 volts. The undervoltage threshold recommended by some cell suppliers is 2.3 volts. If for some reason the cell voltage were to fall to 2.3 volts, the safety circuit 201 would open the discharge FET 206, thereby preventing further discharge of the cell 202.

When a user or technician actuates the switch 211, this invention takes advantage of the undervoltage circuit 203 and its corresponding reference voltage 210 to determine whether the capacity exceeds a predetermined capacity threshold. When the switch 211 is actuated, the midpoint 212 of resistor divider 209 is coupled to the Vdd pin 204 of the safety circuit 201. Now, instead of monitoring the cell voltage, the undervoltage circuit 203 is monitoring a scaled down cell voltage. With the proper scaling, the voltage reference 210 can be used to determine if the cell 202 is above or below a particular capacity.

For example, experimental results have shown that for a typical single, lithium-ion cell, when the cell voltage is approximately 3.82 volts, the cell 202 has approximately 60% of its full capacity remaining. For a 2.6 volt reference voltage 210, if the resistor divider 209 has a top resistor 215 of 470 ohms, and a bottom resistor 216 of 1000 ohms, the midpoint 212 of the resistor divider 209 will be 2.6 volts when the cell voltage is 3.82 volts. As such, if the cell is above 3.82 volts, i.e. above 60% capacity, the safety circuit 201 will keep the discharge FET 206 closed, thereby allowing current to flow through the LED 208. If the cell voltage is below 3.82 volts, i.e. below 60% capacity, the safety circuit 201 will open the discharge FET 206, thereby preventing current from flowing through the LED 208, causing it to turn off. As such, the user knows whether the cell is above or below 60% capacity by looking to see whether the LED 208 is on or off when the switch 211 is actuated.

To summarize, when the divided voltage from the midpoint 212 of the voltage divider 209 is above a predetermined voltage threshold corresponding to an amount of energy remaining in the cell 202, the capacity indicator 208 will be in a first state, for example illuminated if the capacity indicator 208 is a LED. When the divided voltage from the midpoint 212 of the voltage divider 209 is below a predetermined voltage threshold, the capacity indicator 208 will be in a second state, for example not illuminated. In one particular embodiment, an output 217 of the safety circuit 201 determines the state of the capacity indicator 208 by causing the current interrupt device 206 to enter either a low or high impedance state. Where the current interrupt device 206 is a discharge FET, the output 217 does this by turning the discharge FET on or off.

Figure 3:
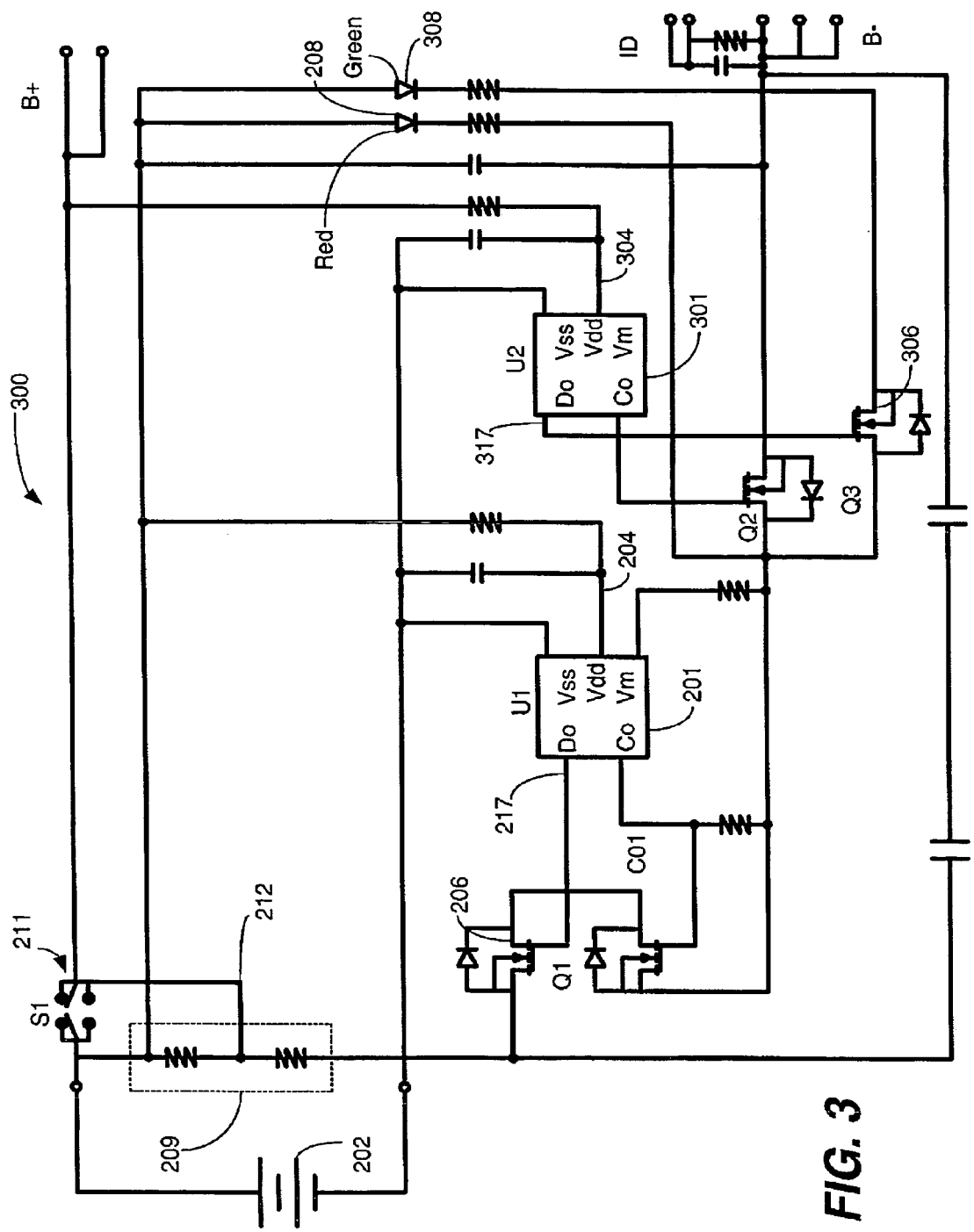
FIG. 3 illustrates a fuel gauging circuit in accordance with the invention employing multiple safety circuits.

Turning now to FIG. 3, illustrated therein is a rechargeable battery pack 300 utilizing two safety circuits 201,301 in accordance with the invention. Many of the components, including the first safety circuit 201 and associated inputs and outputs, the voltage divider 209, the discharge FET 206 and the capacity indicator 208 are the same as in FIG. 2. A second safety circuit 301, second capacity indicator 308 and second discharge FET 306 add additional resolution to the fuel gauge function of the circuit 300.

One difference between FIGS. 2 and 3 is in the switch arrangement. Note that multiple switch arrangements may be used to selectively couple the voltage divider 209 and capacity indicators 208,308 into the circuit 200. In FIG. 2, a pair of switches 211 and 213 was used to couple the fuel gauging components to the circuit. In the embodiment of FIG. 3, a single switch, i.e. switch 211, when closed, couples the cell voltage to both the voltage divider 209 and the capacity indicators 208,308. In such an embodiment, the circuit has a normal mode, where switch 211 is open, and a fuel gauge mode, where switch 211 is actuated. In the normal mode, switch 211 is open, and the voltage divider 209 and capacity indicator 208 are not coupled to the circuit 200. As such, in the normal mode, the safety circuit works in its normal fashion, monitoring the safety of the cells. Additionally, there is no additional cell 202 current drain caused by the fuel gauging components, since neither the voltage divider 209 nor capacity indicators are coupled to the circuit 200 in the normal mode. In test mode, when the switch 211 is actuated, the midpoint 212 of the voltage divider 209 is selectively coupled to the Vdd pins 204,304 of the safety circuits 201,301.

As with FIG. 2, the circuit includes at least one rechargeable cell 202. At least a first and a second safety circuits 201,301 are coupled to the cell 202. The safety circuits 201,301 each include an input 204,304, an internal undervoltage circuit for comparing a voltage present at the input to an internal reference voltage (as shown in FIGS. 1 and 2, e.g. element 203 of FIG. 2), and an output 217,317, wherein the output changes state when the voltage present at the input falls below a predetermined reference voltage threshold.

As in FIG. 2, a voltage divider 209 is coupled across the cell 202. The switch 211 is a dual-pole dual-throw switch. In the normal mode, this dual-pole, dual-throw switch is released. In test mode, the dual-pole, dual-throw switch is pressed or actuated. The switch 211 is provided for selectively coupling either the cell voltage or a divided voltage from the midpoint 212 of the voltage divider 209 to the inputs 204,304 of the first and second safety circuits 201, 301. A pair of capacity indicators 208,308 is coupled to each of the safety circuits 201,301 by way of discharge FETs 206,306.

Additional resolution is provided because the reference voltages of the two safety circuits 201,301 are different from each other. For exemplary and discussion purposes, presume that the reference voltage of the undervoltage circuit in the first safety circuit 201 is 2.3 volts as recited in FIG. 2. Since the undervoltage circuit reference voltage can be between 2 and 3 volts in most commonly available safety circuits, presume that the reference voltage in the undervoltage circuit of the second safety circuit 301 is 2.6 volts.

As noted above, experimental results have shown that a cell 202 with a voltage of 3.82 volts is about 60% charged. Similarly, a cell with a voltage of 3.38 volts is about 2% charged. For discussion purposes, these voltages will represent two predetermined capacity thresholds. It will be clear to those of ordinary skill in the art that any number of thresholds may be employed, depending upon the application.

Presume that when the dual-pole, dual-throw switch is pressed or otherwise actuated, the voltage of the cell 202 is 3.9 volts. The scaled down voltage at the midpoint 212 of the voltage divider 209, presuming resistors of 470 ohms and 1000 ohms as in FIG. 2, will be 2.65 volts, which is greater than either the 2.6 volt reference or the 2.3 volt reference. As such, safety circuit 201 will close discharge FET 206. Similarly, safety circuit 301 will close discharge FET 306. With both discharge FETS 206,306 closed, current will flow through both LED 208 and LED 308. If LED 208 is a green LED, and if LED 308 is a red LED, the resulting light will be yellow. To a user, this may indicate that the capacity of the cell 202 is greater than 60%.

If the cell voltage is 3.5 volts, then the voltage at the midpoint node 212 of the voltage divider 209 will be 2.38 volts, which is below the 2.6 volt reference but above the 2.3 volt reference. As such, safety circuit 301 will open discharge FET 306, but safety circuit 201 will keep discharge FET 206 closed. The result is that green LED 208 will be on, while red LED 308 will be off. The resulting light indication will be green, which may indicate to a user that the cell capacity is between 2% and 60%.

As a third example, presume that the cell voltage is 3.2 volts. (3.0 volts is selected for exemplary purposes only.) The voltage at the midpoint node 212 of the voltage divider 209 will be therefore be 2.18 volts, which is below both the 2.6 volt reference and the 2.3 volt reference. As such, safety circuit 201 will open discharge FET 206. Since discharge FET 206 is coupled along a common current path with both capacity indicators 208,308, the result is that green LED 208 will be off, as will red LED 308. The resulting light indication will be darkness, which may indicate to a user that the cell capacity is below 2%.

Note that while 60% and 2% have been used as examples, any variety of capacities can be used. One must simply change the voltage divider 209 and/or the reference voltages in the safety circuits 201,301 accordingly. For single cell lithium applications, the predetermined voltage threshold corresponding to capacity may theoretically be anywhere from 2.0 to 4.2 volts.

To summarize the operation of the pack of FIG. 3, when the divided voltage at the midpoint 212 of the voltage divider 209 exceeds both the reference voltage of the first safety circuit 201 and the reference voltage of the second safety circuit 301, the first capacity indicator 208 and the second capacity indicator 308 are in a first state, for example illuminated.

When the divided voltage exceeds the reference voltage of the first safety circuit 201, yet falls below the reference voltage of the second safety circuit 301, the first capacity indicator 208 is in a first state, for example illuminated, and the second capacity indicator 308 is in a second state, When the divided voltage falls below both the reference voltage of the first safety circuit 201 and the reference voltage of the second safety circuit 301, both the first capacity indicator 208 and the second capacity indicator 308 are in a second state. Where the first capacity indicator 208 and the second capacity indicator 308 each comprise light emitting diodes, one state may be illuminated and another may be non-illuminated. For increased resolution the color of the first light emitting diode has a color may be different from the color of the second light emitting diode.

In the circuit of FIG. 3, the output 217 of the first safety circuit 201 is coupled to a first transistor 206 that is coupled serially with the cell 202. The output 317 of the second safety circuit 301 is coupled to a second transistor 306 that is coupled serially with the cell 202. When the output 217 of the first safety circuit 202 changes to an undervoltage output state, the first transistor 206 enters a high impedance state. When the output 317 of the second safety circuit 301 changes to an undervoltage output state, the second transistor 306 enters a high impedance state. When the first transistor 206 is in a high impedance state, both the first light emitting diode 208 and the second emitting diode 308 are not illuminated. When only the second transistor 306 is in a high impedance state, only the second light emitting diode 308 is not illuminated.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims.

What is claimed is:

1. A fuel gauging circuit for a rechargeable battery, comprising:
   a. at least one rechargeable cell;
   b. a safety circuit coupled to the at least one rechargeable cell, the safety circuit comprising a circuit for monitoring a voltage across the at least one rechargeable cell;
   c. at least one current interrupt device coupled serially with the at least one rechargeable cell;
   d. a capacity indicator coupled to the at least one current interrupt device;
   e. a voltage divider coupled across the at least one rechargeable cell; and
   f. a switch, wherein when the switch is actuated, the voltage divider is selectively coupled to the safety circuit;
   wherein when a divided voltage from the voltage divider exceeds a predetermined voltage threshold, the capacity indicator is in a first state.

2. The circuit of claim 1, wherein when the divided voltage is below the predetermined voltage threshold, the capacity indicator is in a second state.

3. The circuit of claim 2, wherein the safety circuit comprises at least one output coupled to the at least one current interrupt device, wherein the at least one output causes the at least one current interrupt device to enter a high impedance state when the voltage across the at least one rechargeable cell falls below a reference voltage.

4. The circuit of claim 3, wherein the capacity indicator comprises a light emitting diode.

5. The circuit of claim 4, wherein the first state comprises the light emitting diode being illuminated.

6. The circuit of claim 3, wherein the predetermined voltage threshold corresponds to an amount of energy remaining in the at least one rechargeable cell.

7. The circuit of claim 5, wherein the voltage divider comprises a resistor divider.

8. The circuit of claim 3, wherein the predetermined voltage threshold is between 2.0 and 4.2 volts.

9. The circuit of claim 1, wherein the current interrupt device comprises a transistor.

10. A rechargeable battery pack, comprising:
    a. at least one rechargeable cell;
    b. at least a first and a second safety circuits, each of the first and second safety circuits comprising:
       i. an input;
       ii. a circuit for comparing a voltage present at the input to a reference voltage;
       iii. an output, wherein the output voltage changes output state when the voltage present at the input falls below the reference voltage;
    c. a voltage divider coupled across the at least one rechargeable cell;
    d. a switch for selectively coupling either a voltage across the at least one rechargeable cell or a divided voltage from the voltage divider to the inputs of the first and second safety circuits; and
    e. a first capacity indicator coupled to the first safety circuit, and a second capacity indicator coupled to the first and the second safety circuits;
    wherein the reference voltage of the first safety circuit is different from the reference voltage of the second safety circuit.

11. The pack of claim 10, wherein when the divided voltage exceeds both the reference voltage of the first safety circuit and the reference voltage of the second safety circuit, the first capacity indicator and the second capacity indicator are in a first state.

12. The pack of claim 10, wherein when the divided voltage exceeds the reference voltage of the first safety circuit and falls below the reference voltage of the second safety circuit, the first capacity indicator is in a first state and the second capacity indicator is in a second state.

13. The pack of claim 10, wherein when the divided voltage falls below both the reference voltage of the first safety circuit and the reference voltage of the second safety circuit, both the first capacity indicator and the second capacity indicator are in a second state.

14. The pack of claim 10, wherein the first capacity indicator and the second capacity indicator each comprise light emitting diodes.

15. The pack of claim 14, wherein the first light emitting diode has a color that is different from the second light emitting diode.

16. The pack of claim 15, wherein the output of the first safety circuit is coupled to a first transistor that is coupled serially with the at least one rechargeable cell, further wherein the output of the second safety circuit is coupled to a second transistor that is coupled serially with the at least one rechargeable cell.

17. The pack of claim 16, wherein when the output of the first safety circuit changes output state, the first transistor enters a high impedance state.

18. The pack of claim 16, wherein when the output of the second safety circuit changes output state, the second transistor enters a high impedance state.

19. The pack of claim 17, wherein when the first transistor is in a high impedance state, both the first and the second light emitting diodes are not illuminated.

20. The pack of claim 18, wherein when the second transistor is in a high impedance state, the second light emitting diode is not illuminated.

* * * * *